(12) United States Patent
Lin

(10) Patent No.: US 10,950,911 B2
(45) Date of Patent: *Mar. 16, 2021

(54) BATTERY PACK WITH ROTARY ENCODER

(71) Applicant: MOBILETRON ELECTRONICS CO., LTD., Taichung (TW)

(72) Inventor: Meng-Chang Lin, Taichung (TW)

(73) Assignee: MOBILETRON ELECTRONICS CO., LTD., Taichung (TW)

(*) Notice: Subject to any disclaimer, the term of this patent is extended or adjusted under 35 U.S.C. 154(b) by 403 days.

This patent is subject to a terminal disclaimer.

(21) Appl. No.: 15/966,335

(22) Filed: Apr. 30, 2018

(65) Prior Publication Data

US 2019/0252651 A1    Aug. 15, 2019

(30) Foreign Application Priority Data

Feb. 14, 2018 (TW) ................................ 107105419

(51) Int. Cl.
| | |
|---|---|
| *H01M 50/20* | (2021.01) |
| *H01M 10/04* | (2006.01) |
| *H01M 10/42* | (2006.01) |
| *G01R 31/382* | (2019.01) |

(52) U.S. Cl.
CPC .......... *H01M 50/20* (2021.01); *G01R 31/382* (2019.01); *H01M 10/0431* (2013.01); *H01M 10/425* (2013.01); *H01M 2010/4271* (2013.01)

(58) Field of Classification Search
CPC .... H01M 2/1016; H01M 50/20; G01R 31/382

USPC .................................................. 320/106, 112
See application file for complete search history.

(56) References Cited

U.S. PATENT DOCUMENTS

| | | | | |
|---|---|---|---|---|
| 5,792,138 A | * | 8/1998 | Shipp ..................... | A61B 18/12 429/61 |
| 6,194,866 B1 | * | 2/2001 | Olsson .................. | H01M 10/42 320/106 |
| 7,498,767 B2 | * | 3/2009 | Brown ................. | G06Q 30/012 320/107 |
| 10,203,230 B2 | * | 2/2019 | Von Berg ............. | G01D 5/2454 |
| 2015/0015245 A1 | * | 1/2015 | Inoue ....................... | G01D 5/12 324/207.13 |

* cited by examiner

*Primary Examiner* — Richard V Muralidar
(74) *Attorney, Agent, or Firm* — Tracy Heims; Apex Juris, Pllc.

(57) ABSTRACT

A battery pack includes a casing, a battery cell assembly, an encoder, and a monitoring unit; the battery cell assembly is disposed in the casing; the encoder is adapted to generate one of a plurality of types of encoding configurations, and includes an operating section which is adapted for a user to set one of the encoding configurations of the encoder manually; the monitoring unit is adapted to sense a state of the battery cell assembly and generate an identification code according to the encoding configuration of the encoder; wherein, the monitoring unit is further adapted to output a state signal which includes the aforementioned identification code. Whereby, the battery pack of the present invention would be a universal battery pack.

6 Claims, 3 Drawing Sheets

US 10,950,911 B2

BATTERY PACK WITH ROTARY ENCODER

BACKGROUND OF THE INVENTION

Technical Field

The present invention is related to batteries, and more particularly to a battery pack.

Description of Related Art

With the advancement in technology, the demand for electricity is increasing. Power supplies such as alternating current or battery packs consisting of a plurality of connected battery cells could be utilized to supply a large amount of electricity. The advantage of battery packs is that the power supply is movable and would not be limited to a fixed location.

A conventional battery pack mainly includes a plurality of battery cell assemblies and a monitoring unit, wherein the battery cell assemblies are adapted to supply power, and the monitoring unit is electronically connected to the battery cell assemblies to sense a state of each of the battery cell assemblies such as a voltage, a current, and a temperature. The monitoring unit converts the state of each of the battery cell assemblies together with an identification code into a state signal to be sent out, which is adapted for a battery management apparatus to identify the battery pack subsequently. The aforementioned identification code is burned into a non-volatile memory of the monitoring unit as the battery pack is manufactured. Hence, it is required to utilize a recording apparatus to alter the identification code stored in the non-volatile memory, resulting in inconvenience in altering the identification code.

BRIEF SUMMARY OF THE INVENTION

In view of the above, an object of the present invention is to provide a battery pack which is adapted for a user to adjust an identification code of the battery pack fast.

To achieve the object mentioned above, the present invention provides a battery pack including a casing, a battery cell assembly, an encoder, and a monitoring unit; the battery cell assembly is disposed in the casing; the encoder is adapted to generate one of a plurality of types of encoding configurations, and includes an operating section which is adapted for a user to set one encoding configuration of the encoder manually; the monitoring unit is electronically connected to the battery cell assembly and the encoder, and is adapted to sense a state of the battery cell assembly and generate an identification code according to the encoding configuration of the encoder; wherein, the monitoring unit is further adapted to output a state signal which includes the identification code and the state of the battery cell assembly.

The advantage of the present invention is that the user could alter the encoding configuration with the operating section directly, thereby altering the identification code of the battery pack, and the battery pack of this embodiment would become a universal battery pack, that is, it is not required to set a unique identification code for the battery pack when the battery pack is manufactured.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
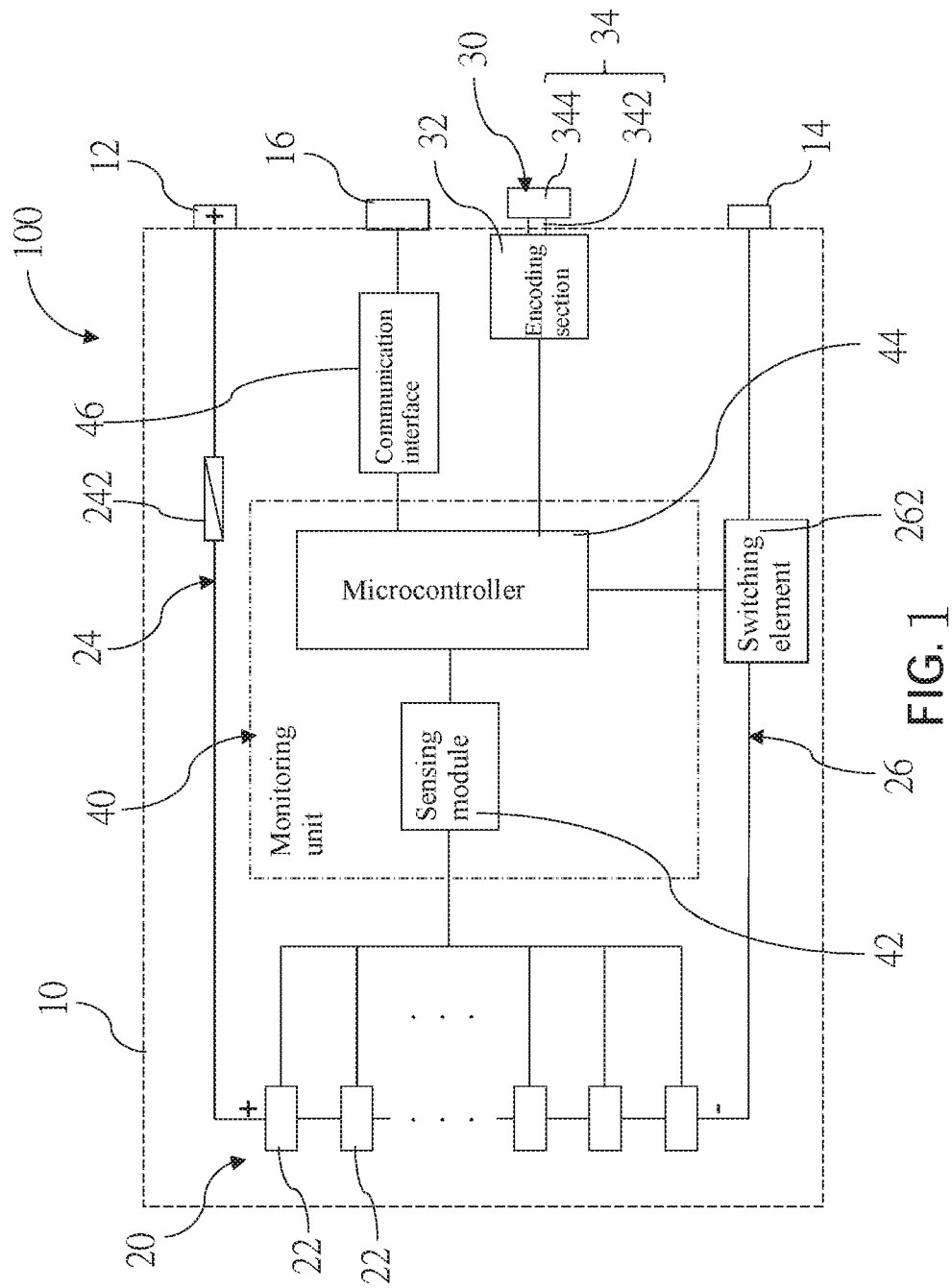
FIG. 1 is a block diagram of a battery pack of an embodiment according to the present invention.
Figure 2:
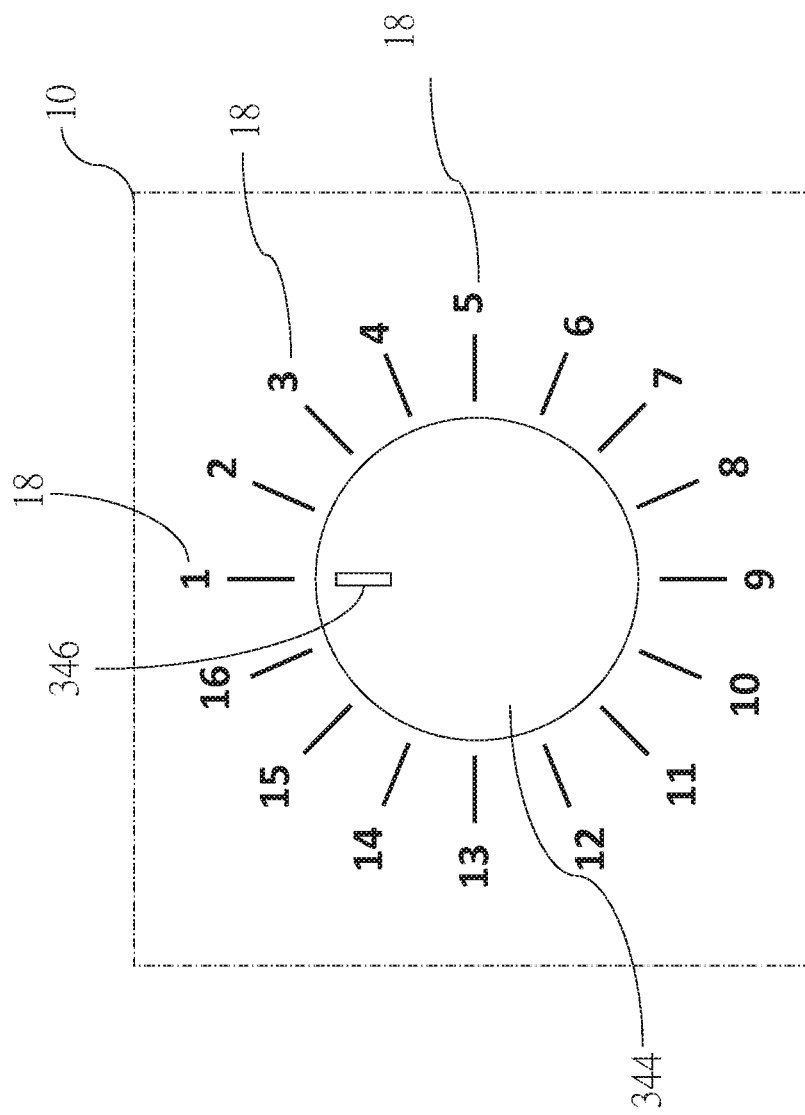
FIG. 2 is a schematic view showing the knob and the coded marks of the battery pack of FIG. 1.

The following illustrative embodiments and drawings are provided to illustrate the disclosure of the present invention, these and other advantages and effects can be clearly understood by persons skilled in the art after reading the disclosure of this specification. As shown in FIG. 1 and FIG. 2, a battery pack 100 of an embodiment according to the present invention includes a casing 10, a battery cell assembly 20, an encoder 30, and a monitoring unit 40 for monitoring the battery pack 100.

The casing 10 is disposed with a positive terminal 12, a negative terminal 14, and a communication terminal 16.

The battery cell assembly 20 is disposed in the casing 10 and includes a plurality of series-connected battery cells 22. A positive electrode of the battery cell assembly 20 is electronically connected to the positive terminal 12 via a first conductive member 24, and a negative electrode of the battery cell assembly 20 is electronically connected to the negative terminal 14 via a second conductive member 26, whereby to output power from the positive terminal 12 and the negative terminal 14. In this embodiment, one of the first conductive member 24 and the second conductive member 26 includes a switching element 262, while another one of the first conductive member 24 and the second conductive member 26 includes a fuse 242. More specifically, the positive electrode of the battery cell assembly 20 is electronically connected to the positive terminal 12 via the fuse 242, and the negative electrode of the battery cell assembly 20 is electronically connected to the negative terminal 14 via the switching element 262, wherein the switching element 262 is controllable to be turned on or off. In practice, the fuse 242 and the switching element 262 could be exchanged with each other to alter their positions; the battery pack 100 could be only disposed with one of the fuse 242 and the switching element 262, or could be disposed without the fuse 242 and the switching element 262.

The encoder 30 could generate one of a plurality of types of encoding configurations, and includes an encoding section 32 and an operating section 34, wherein the encoding section 32 is adapted to generate one of the encoding configurations according to an operation executed on the operating section 34, and the operating section 34 is adapted for a user to set one of the encoding configurations of the encoder 30 manually. The encoding section 32 is disposed in the casing 10, and the operating section 34 extends out of the casing 10. In this embodiment, the encoder 30, which is an encoding switch having four output pins as an example, could generate sixteen types of the encoding configurations. The operating section 34 includes a rotary shaft 342 and a knob 344 connected to the rotary shaft 342, wherein the rotary shaft 342 could be rotated between a plurality of rotating angles, and each of the rotating angles is corresponding to one of the encoding configurations generated by the encoding section 32.

Referring to FIG. 2, in order to identify the generated encoding configuration, a plurality of coded marks 18 are disposed on the casing 10 at a periphery of the operating section 34 (i.e. the coded marks 1 to 16 shown in FIG. 2), wherein each of the coded marks 18 is corresponding to one rotating angle of the rotary shaft 342. An indicator 346 is disposed on the knob 344, and the knob 344 is adapted to be rotated by the user to move the indicator 346 to correspond to one of the coded marks 18. In practice, the indicator 346 could be disposed on any position of the operating section 34 as long as the rotary shaft 342 could be corresponding to one of the coded marks 18 after rotation.

The monitoring unit 40 is electronically connected to the battery cell assembly 20 and the encoding section 32 of the encoder 30. In this embodiment, the monitoring unit 40 includes a sensing module 42 and a microcontroller 44, wherein the sensing module 42 is electronically connected to the battery cell assembly 20 to sense a state of the battery cell assembly 20; the sensed state includes at least one of a total voltage and a total current of the battery cell assembly 20, and a voltage and a temperature of the respective battery cell. The microcontroller 44 is electronically connected to the sensing module 42, the encoder 30, and the switching element 262. In addition, the microcontroller 44 is further electronically connected to the communication terminal 16 via a communication interface 46, wherein the communication interface 46 is adapted to convert a signal output from the microcontroller 44 into a bus signal, which is a CAN-BUS signal as an example. The microcontroller 44 generates an identification code according to the encoding configuration of the encoder 30, and outputs a state signal according to the identification code and the state of the battery cell assembly 20, wherein the state signal is converted into the bus signal via the communication interface 46, and the bus signal is then sent out. In addition, the monitoring unit 40 could further control the switching element 262 to be turned off, thereby enabling the battery cell assembly 20 to stop outputting power to the positive terminal 12 and the negative terminal 14 to cut off the power output from the battery pack 100.

In this way, the state signal output from the battery pack 100 includes the identification code corresponding to the encoding configuration of the encoder 30 and the state of the battery cell assembly 20. The user could operate the operating section 34 of the encoder 30 to alter the encoding configuration manually and further alter the identification code of the battery pack 100. Whereby, the battery pack 100 of this embodiment would become a universal battery pack, that is, it is not required to set a unique identification code for the battery pack 100 when the battery pack 100 is manufactured.

Figure 3:
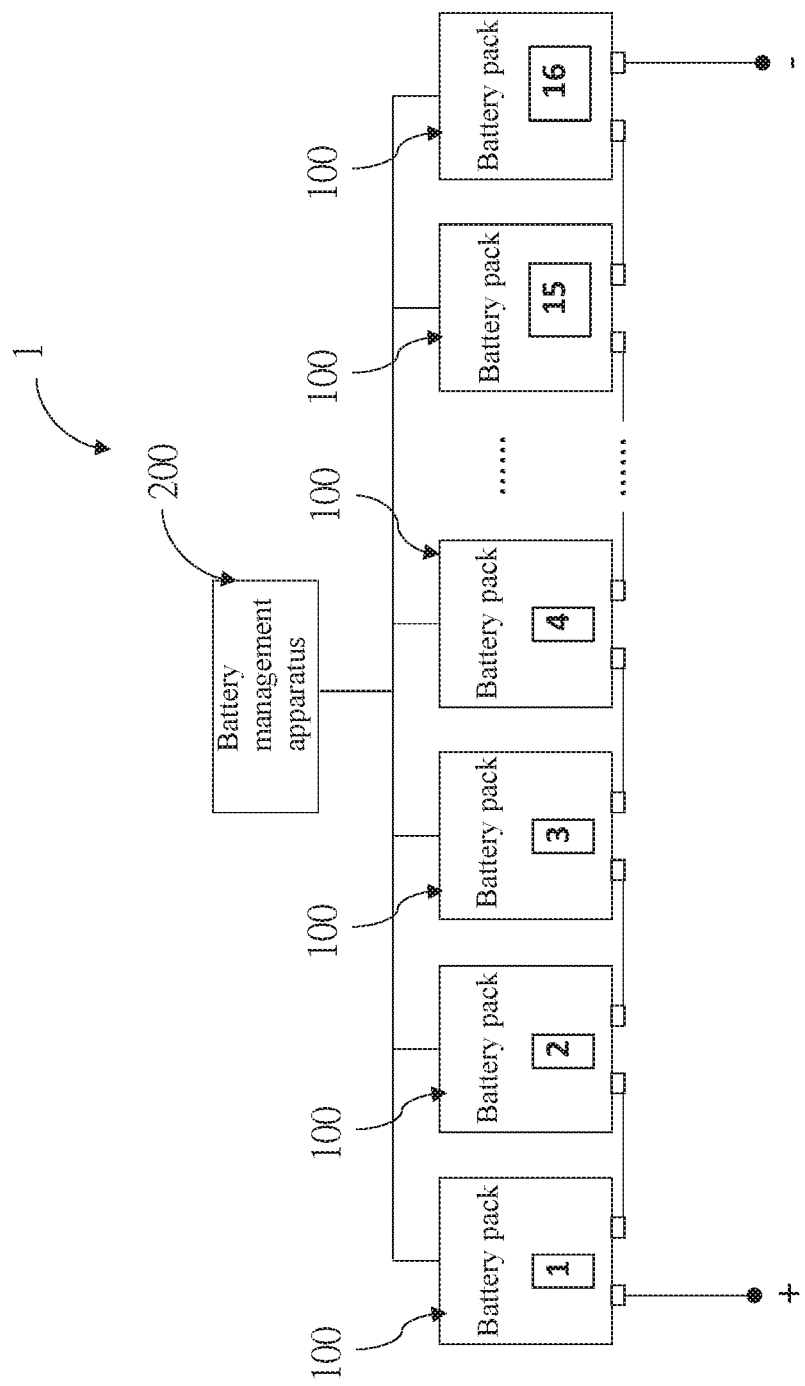
FIG. 3 is a block diagram of an electric power system of an embodiment according to the present invention.

As shown in FIG. 3, an electric power system 1 consisting of a plurality of battery packs 100 provided by this embodiment is illustrated. A battery management apparatus 200 of the electric power system 1 is connected to the communication terminal 16 of each of the battery packs 100 via the bus, whereby to communicate with the monitoring unit 40. The user could set the encoding configuration of the encoder 30 of each of the battery packs 100 directly as the electric power system 1 is assembled, and the operating section 34 disposed outside of the casing 10 would be convenient for the user to adjust the encoding configuration. After setting each of the battery packs 100 with different encoding configuration (i.e. the encoding configuration 1 to 16 shown in FIG. 3), each of the battery packs 100 would transmit the state signal to the battery management apparatus 200. After analyzing the received state signal, the battery management apparatus 200 could identify the battery pack 100 which transmitted the state signal.

It is worth mentioning that when it is required to replace one of the battery packs 100, the original battery pack 100 could be removed and replaced with a new one; meanwhile, the encoding configuration of the encoder 30 of the new battery pack 100 could be set the same as the encoding configuration of the original battery pack 100. Whereby, it is not required to burn the identification code again, and the drawback of the conventional battery packs could be solved efficiently.

It must be pointed out that the embodiments described above are only some embodiments of the present invention. All equivalent structures which employ the concepts disclosed in this specification and the appended claims should fall within the scope of the present invention.

What is claimed is:

1. A battery pack, comprising:
   a casing;
   a battery cell assembly, disposed in the casing;
   an encoder, adapted to generate one of a plurality of types of encoding configurations, and including an operating section which is adapted for a user to set the one of the encoding configurations of the encoder manually; and
   a monitoring unit, being electronically connected to the battery cell assembly and the encoder, and being adapted to sense a state of the battery cell assembly and generate an identification code according to the encoding configuration of the encoder; wherein, the monitoring unit is further adapted to output a state signal which includes the identification code and the state of the battery cell assembly.

2. The battery pack of claim 1, wherein the encoder further includes an encoding section; the encoding section is adapted to generate the one of the encoding configurations in response to the operating section; the encoding section is disposed in the casing and is electronically connected to the monitoring unit, and the operating section extends out of the casing.

3. The battery pack of claim 2, wherein the operating section of the encoder further includes a rotary shaft; the rotary shaft could be rotated between a plurality of rotating angles, and each of the rotating angles is corresponding to the one of the encoding configurations which is generated by the encoding section; an indicator is disposed on the operating section;
   a plurality of coded marks are disposed outside of the operating section, wherein each of the coded marks is corresponding to one rotating angle of the rotary shaft, and the indicator is corresponding to one of the coded marks.

4. The battery pack of claim 3, wherein the operating section of the encoder further includes a knob; the knob includes the indicator; the coded marks surround a periphery of the knob.

5. The battery pack of claim 1, further comprising a positive terminal and a negative terminal disposed with the casing; a positive electrode of the battery cell assembly is electronically connected to the positive terminal via a conductive member, and a negative electrode of the battery cell assembly is electronically connected to the negative terminal via another conductive member, wherein one of the conductive member and the another conductive member includes a switching element; the switching element is electronically connected to the monitoring unit and is controllable to be turned on or off with the monitoring unit.

6. The battery pack of claim 5, wherein another one of the conductive member and the another conductive member further includes a fuse.

* * * * *